(12) United States Patent
Wu et al.

(10) Patent No.: US 6,320,380 B1
(45) Date of Patent: Nov. 20, 2001

(54) MRI METHOD AND APPARATUS FOR INCREASING THE EFFICIENCY OF ECHO LANAR IMAGING AND OTHER LATE ECHO TECHNIQUES

(75) Inventors: Dee H. Wu, Shaker Heights; Michael R. Thompson, Cleveland Heights, both of OH (US)

(73) Assignee: Marconi Medical Systems, Inc., Highland Heights, OH (US)

( * ) Notice: Subject to any disclaimer, the term of this patent is extended or adjusted under 35 U.S.C. 154(b) by 0 days.

(21) Appl. No.: 09/677,988

(22) Filed: Oct. 3, 2000

(51) Int. Cl.$^7$ ....................................................... G01V 3/00
(52) U.S. Cl. ............................................ 324/309; 324/307
(58) Field of Search ................................... 324/309, 312, 324/306, 307, 314

(56) References Cited

U.S. PATENT DOCUMENTS

| | | | |
|---|---|---|---|
| 4,720,678 | * | 1/1988 | Glover et al. .......................... 324/309 |
| 5,089,778 | | 2/1992 | Zakhor et al. .......................... 324/312 |

OTHER PUBLICATIONS

Orrison, Jr., et al., "Functional Brain Imaging", New York, Moseby, 1995 pp. 239–243.

Simonson, et al., "MR Evaluation of Stroke", MR Pulse 1995; 2(1) :12–13.

Yuh, et al., "Fibrinolytic Treatment of Acute Stroke:Are We Treating Reversible Cerebral Ischemia?" Am J. Neuroradiol 1995; 16(10) :1994–2000.

Rosen, et al., "Susceptibility Contrast Imaging of Cerebral Blood Volume: Human Experience", Magn. Reson. Med 1991; 22 (2) :293–99.

Wu, et al. "On–Line Time–to–Peak MRI Method Enables Rapid and Robust Discrimination Between Infarcted and At–Risk Tissue in Clinical Stroke Patients", Proceedings of RSNA, Chicago, 1997; 387–388 (Monograph 1042).

Stejekal, et al. "Spin Diffusion Measurements: Spin Echoes in the Presence of Time–Dependent Field Gradient", J. Chemical Physics 1965;42:288–292.

Ogawa, et al., "Magnetic Resonance Imaging of Blood Vessels at High Fields: In Vivo and In Vitro Measurements and Image Simulation", Magn Reson Med 1990; 16 (1) :9–18.

Rosen, et al., "Perfusion Imaging With NMR Contrast Agents", Magn Reson Med 1990; 14 (2) :249–65.

Belliveau, et al., "Magnetic Resonance Imaging Mapping of Brain Function. Human Visual Cortex", Invest. Radiol. 1992;27 Suppl 2:S59–65.

Kwong, et al., "Dynamic Magnetic Resonance Imaging of Human Brain Activity During Primary Sensory Stimulation", Proc. Natl. Acad. Sci. USA 1992;89 (12) :5676–79.

Turner, et al., "Functional Mapping of the Human Visual Cortex at 4 and 1.5 Tesla Using Deoxygenation Contrast EPI", Magn. Res. Med 1993; 29 (2) :277–79.

Ludeke, et al. "Susceptibility Artifacts in NMR Imaging", Magn. Reson. Med 1985; 3 (4) :329–43.

Hu, et al., "Artifact Reduction in EPI with Phase–Encoded Reference Scan" Magn. Reson. Med 36: 166–171 (1996).

Jezzard, et al., "Correction for Geometric Distortion in Echo Planar Images from B0 Field Variation", Magn. Reson. Med 1995 Jul., 34 (1) 65–73.

* cited by examiner

Primary Examiner—Jay Patidar
Assistant Examiner—Brij B. Shrivastav
(74) Attorney, Agent, or Firm—Fay, Sharpe, Fagan, Minnich & McKee, LLP

(57) ABSTRACT

An MRI scanning method and apparatus provide increased efficiency by oversampling in the phase encoding direction. The oversampling is performed during one or more time periods (112) during the scanning sequence that would normally be unused. The addition phase encoding steps (132, 134) can be used to enhance overall image resolution. In preferred embodiments, additional phase encoding steps reduce or eliminate N/2 ghost artifacts with no increase in imaging time. Image throughput is improved by obviating the need for ghost removal post-processing of the image data.

12 Claims, 7 Drawing Sheets

MRI METHOD AND APPARATUS FOR INCREASING THE EFFICIENCY OF ECHO LANAR IMAGING AND OTHER LATE ECHO TECHNIQUES

BACKGROUND OF THE INVENTION

The present invention relates to the art of medical diagnostic imaging. It finds particular application in conjunction with magnetic resonance imaging (MRI) techniques utilizing late echo pulse echo planar imaging (EPI) and will be described with particular reference thereto. However, it is to be appreciated that the present invention is also amenable to other magnetic resonance applications.

Commonly, in MRI, a substantially uniform temporally constant main magnetic field, $B_0$, is set up in an examination region in which a subject being imaged or examined is placed. Via magnetic resonance radio frequency (RF) excitation and manipulations, selected magnetic dipoles in the subject which are otherwise aligned with the main magnetic field are tipped to excite magnetic resonance. The resonance is typically manipulated to induce detectable magnetic resonance echoes from a selected region of the subject. In imaging, the echoes are spatially encoded via magnetic gradients set up in the main magnetic field. The raw data from the MRI scanner is collected into a matrix, commonly known as k-space. By employing Inverse Fourier, Two-dimensional Fourier, or other known transformations, an image representation of the subject is reconstructed from the k-space data.

Echo planar imaging (EPI) is a rapid MRI technique which is used to produce magnetic resonance echos at high acquisition rates. It has been found useful in perfusion and/or diffusion studies, for functional magnetic resonance imaging (fMRI), in dynamic-contrast studies, etc. However, images obtained in EPI experiments tend to be vulnerable to an artifact known as "N/2" or "Nyquist" ghosting that produces ghost images typically positioned at N/2 pixels relative to the true or desired object image position (where N is the number of pixels across the image field of view (FOV)). More specifically, alternating errors or cyclic errors can be generated in the k-space data due to common system limitations or imperfections such as, e.g., imperfect gradient application, non-linear system responses (i.e., Maxwell fields, mechanical displacements or vibrations, etc.), instabilities in digital to analog conversion timing, or inherent properties of the imaged object (i.e., susceptibility differences, flow/respiratory changes, chemical shifts, etc.). The cyclic errors are typically created by differences in the odd and even horizontal data lines of k-space, e.g., misalignment of the data line peaks, or phase shift errors. These may be denoted as cyclic errors, because each full cycle of the readout gradient contains both a positive polarity portion and a negative polarity portion, and within the full cycle there is typically mismatch or error between the two polarity portions. The same error is largely repeated in each successive cycle. Likewise, these errors may be denoted as alternating, because each cycle typically produces a pair of consecutive data lines, with the odd numbered lines exhibiting substantially consistent data, the even numbered lines also being substantially consistent, but the neighboring even and odd lines exhibiting relative error or inconsistency. In any event, the Fourier reconstruction tends to convert the cyclic errors into secondary images or "ghosts" that are shifted by a half-image from the primary or true desired image of the object.

The ghost images can obscure the true desired image, reduce image clarity or sharpness, and generally degrade overall image quality. Moreover, high levels of ghosting can produce false readings that lead to diagnostic error. Accordingly, it is highly desirable to produce EPI images that are essentially free of ghost artifacts.

A number of techniques have been developed for addressing ghost artifacts. However, such techniques remain subject to certain drawbacks or limitations. For example, one popular and well-known method for EPI ghost reduction employs a reference scan with zero phase encoding prior to the imaging pulse sequence. By examining offsets in the echo between even and odd echo acquisitions, a set of phase correction values is determined. The goal of the phase reference scan technique has typically been to remove zero and first order phase differences between odd and even echoes, and has been shown capable of reducing an amount of ghosting. Still, the phase reference scan technique is known to occasionally increase the N/2 ghosting artifact. Reference scan methods may introduce error into images if there is deviation or inconsistency between the reference acquisition and the associated image acquisition, or if there are flawed results generated from the analysis of the reference image.

Another method in the prior art involves the collection of EPI raw data in which a data line or small number of data lines are replicated. Time shifts and perhaps phase shifts can then be estimated by looking at the location and phases of maximal signal in each line of the free induction decay (FID) readout. However, this technique is disadvantageous insomuch as the additional data lines disrupt the continuous readout in the phase encode direction and introduces point spread errors for signals not on resonance. Additionally, estimating phase differences between alternating data lines with only two data lines can result in an inability to discern the alternating part of the signal variation from gradual linear (non-alternating) drifts which cause peak misalignment.

Moreover, many previously developed techniques are relatively complex and time intensive. For example, post-processing of the collected k-space data using ghost removal algorithms is a commonly used technique for reducing the impact of N/2 ghosting. However, such ghost removal algorithms or routines are generally computationally intensive and thus are frequently performed at the expense of additional scans and lengthen reconstruction times. Furthermore, in many cases post-processing ghost removal techniques do not adequately eliminate ghosting artifacts and, on some occasions, have been known to increase the amount of ghosting artifact. Additionally, some techniques require active operator intervention and/or judgment to effect ghost reduction, thereby putting demands on the operator's time and leaving open the possibility of operator error.

In prior art systems, the number of read encoding steps ($N_{ro}$) is typically equal to or greater than the number of phase encoding steps ($N_{pe}$) Additional read steps are obtained by incrementing the data sampling rate. Additional phase encode steps are obtained from additional echoes, which normally increases data acquisition times. Also, matrix sizes are often not selectable to match the geometry of the object to be imaged, but rather, are some fixed value, e.g., 64×64, 64×128, 128×128, 64×192, and so forth (wherein the first number is the number of phase encoding steps and the second number is the number of read encoding steps). For fixed sequences, the adjustments for anatomy can be made during a pilot imaging procedure. A pilot procedure is a quick series of pulse sequences to give an operator images which can be used to size the FOV. However, the adjustments for anatomy are limited and do not necessarily match the geometry of the particular geometric body as it may change from person to person of from object to object. Thus, prior art systems using fixed matrix/resolution EPI sizes produce an inefficient use of sampling time, i.e., wasting valuable k-space territory thereby resulting in inefficient resolution selection, lower image quality (e.g., due to increased partial voluming effects), and/or poor ability for reformatting images.

In addition, the prior art EPI and other multi-echo techniques lack anti-aliasing protection in the phase encoding direction, with ghost-removal routines generally being relied upon to reduce the impact of N/2 ghosting as described above.

The present invention provides a method and apparatus which overcomes the above-referenced problems and others.

SUMMARY OF THE INVENTION

The present invention provides a method of magnetic resonance imaging of a type employing a scanning sequence comprising an RF excitation pulse and a plurality of phase encoding gradient pulses and a repetitively or cyclically switched frequency encoding gradient to produce an echo train emphasizing late echoes, and wherein the scanning sequence has a prespecified length of time. In accordance with the present invention, a subject is supported in an examination region of an MRI scanning apparatus and user selectable sequence, resolution, and contrast parameters are input by an operator to define a prototype MR acquisition sequence. The prototype acquisition sequence defines the manner of application of an RF excitation pulse, a plurality of phase encoding gradient pulses, and the frequency encoding gradient. The prototype acquisition sequence further includes a first data acquisition period for acquiring k-space data which is temporally coextensive with the application of the phase encoding gradient pulses and the frequency encoding gradient. Next, the prototype MR acquisition sequence is analyzed to determine whether at least one of (1) a first time delay or "dead time" occurs between application of the RF excitation pulse and the data acquisition period, and (2) a time delay or dead time occurs after the data acquisition period and before the end of the sequence, i.e., before time to repeat (TR).

By "dead time," it is meant a period of time that is available that is not currently being used, i.e., a time pad due to the late time to echo (TE). The dead time period will typically represent the time between the end of a slice select rephasing gradient and the start of the phase encoding dephasing lobe.

Upon determining the existence of at least one of the first and second dead time periods, a refined prototype acquisition sequence is defined, including a second data acquisition period in which k-space data is collected during at least a portion of at least one of the first dead time period and the second dead time period of the prototype MR acquisition sequence, and the second sequence is applied to induce a detectable magnetic resonance signal from a selected region of the subject. Upon determining an absence of both the first dead time period and the second dead time period, the prototype MR acquisition sequence is applied to induce a detectable magnetic resonance signal from a selected region of the subject. The magnetic resonance signal generated by the applied scanning sequence is then received and demodulated to generate k-space data which is processed to generate an image representation.

In still a further aspect, the present invention provides a method of determining a magnetic resonance imaging sequence of a type employing an RF excitation pulse in conjunction with a plurality of phase encoding gradient pulses and a repetitively or cyclically switched frequency encoding gradient to produce an echo train, wherein the magnetic resonance imaging sequence utilizes late echos of the echo train. User selectable sequence, resolution, and contrast parameters are input to define a prototype MR acquisition sequence defining a pattern of application of an RF excitation pulse, a plurality of phase encoding gradient pulses, and the frequency encoding gradient. The prototype MR acquisition sequence also includes a first data acquisition period for acquiring k-space data which is temporally coextensive with the application of the phase encoding gradient pulses and the frequency encoding gradient. The prototype MR acquisition sequence is analyzed to determine whether a dead time period exists between application of the RF excitation pulse and the data acquisition period, and if there exists a dead time period between application of the RF excitation pulse and the data acquisition period, a refined prototype acquisition sequence and a second data acquisition period are defined wherein k-space data is collected during at least a portion of the dead time period.

In yet a further aspect, the present invention provides a magnetic resonance imaging apparatus comprising magnets for creating a temporally constant magnetic field through an examination region; at least one radio frequency coil assembly disposed adjacent to the examination region for transmitting radio frequency signals into the examination region and for receiving magnetic resonance signals emanating from the examination region; a transmitter connected with the at least one radio frequency coil assembly for supplying radio frequency pulses thereto; a plurality of gradient coils disposed adjacent to the examination region for creating magnetic field gradients across the examination region; gradient pulse amplifiers connected with the gradient coils for applying current pulses to the gradient coils for selectively creating magnetic field gradients across the examination region; an imaging sequence control connected with the transmitter and the gradient amplifiers, the imaging sequence control comprising: (i) control logic receiving user selectable sequence, resolution, and contrast parameters to define a prototype MR acquisition sequence and a first data acquisition period for acquiring k-space data, the prototype MR acquisition sequence defining a pattern of application of an RF excitation pulse and a plurality of phase encoding gradient pulses cyclically switched frequency encoding gradient, the first data acquisition period being temporally coextensive with the application of the plurality of phase encoding gradient pulses and the frequency encoding gradient; (ii) control logic analyzing the prototype MR acquisition sequence and measuring a dead time period between application of the RF excitation pulse and the data acquisition period; and (iii) control logic defining a refined prototype acquisition sequence and a second data acquisition period in which k-space data is collected during at least a portion of the dead time period; a receiver that receives and demodulates the magnetic resonance signal to obtain phase encoded data lines; and an image reconstruction processor for reconstructing the data lines into an electronic image representation.

One advantage of the present invention is that it increases scanning efficiency, particularly in applications where late time to echo (TE) sequences are used, without substantially increasing imaging time.

Another advantage of the present invention is that is can be used to reduce or eliminate N/2 ghost artifacts inside the desired field of view.

Another advantage of the present invention is that it increases image throughput by obviating the need for computationally intensive post processing of the image data for N/2 ghost removal.

Another advantage of the present invention is that it can be used to match shape and field of view (FOV) requirements of the object to be imaged.

Another advantage of the present invention is that it can be used to increase image resolution.

Another advantage of the present invention is that it can be used to provide operator feedback or training to aid an operator in selecting contrast and resolution parameters and in some cases can automate parameter selection and sequence optimization.

Still further advantages and benefits of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating preferred embodiments and are not to be construed as limiting the invention.

DETAILED DESCRIPTION OF THE PREFERRED EMBODIMENTS

Figure 1:
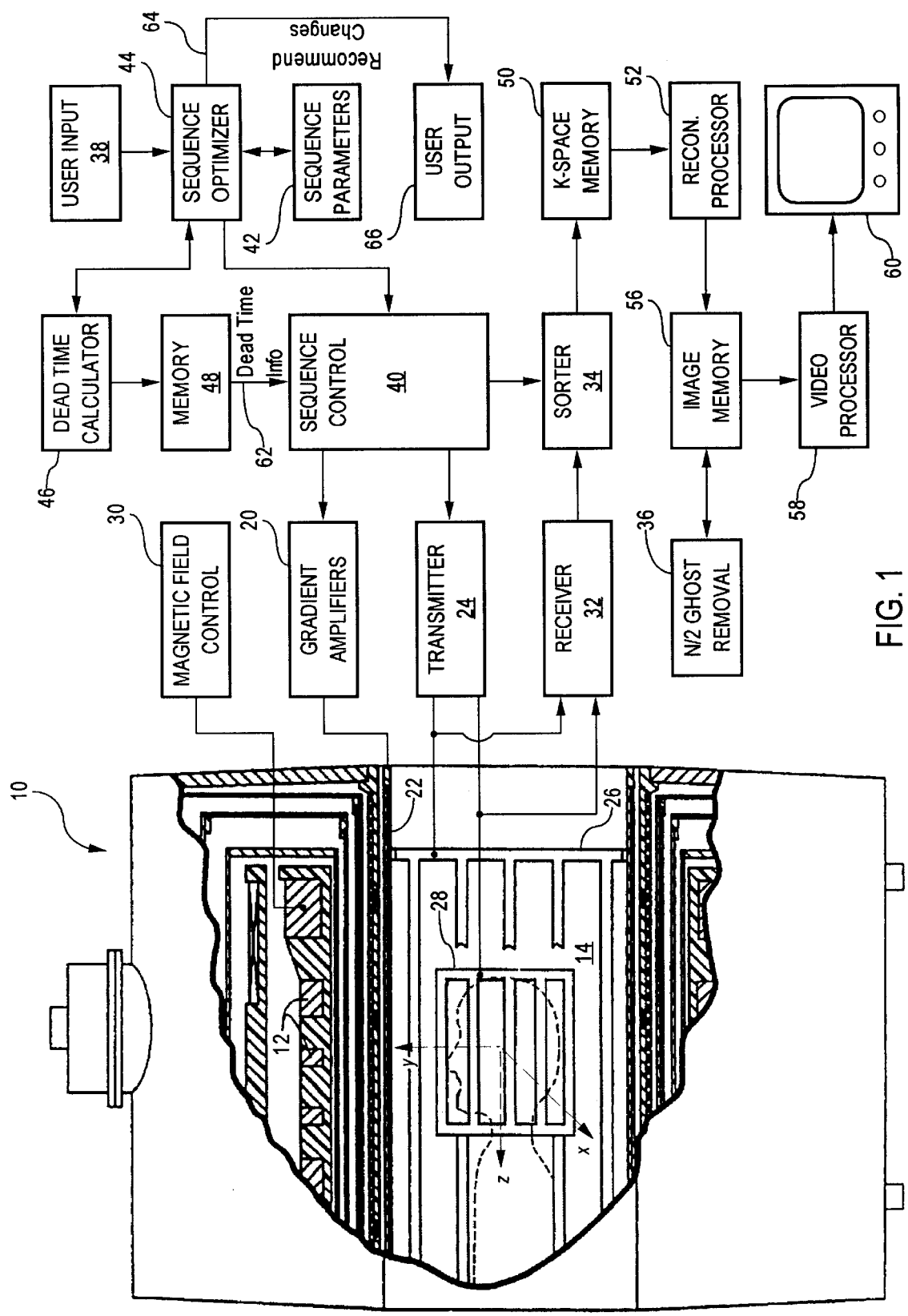
FIG. 1 is a diagrammatic illustration of a magnetic resonance imaging scanner including automated ghost reduction in accordance with aspects of the present invention.

With reference to FIG. 1, an MRI scanner 10 includes a main magnetic field control 30 that controls superconducting or resistive magnets 12 such that a substantially uniform, temporally constant main magnetic field $B_0$ is created along a z-axis through an examination region 14. Although a bore-type magnet is illustrated in FIG. 1, the present invention is equally applicable to open magnet systems and other known types of MRI scanners. An imaging experiment is conducted by executing a magnetic resonance sequence with the subject being imaged or examined (e.g., patient, phantom, or otherwise) placed at least partially within the examination region 14, typically with the region of interest at the isocenter. The magnetic resonance sequence entails a series of RF and magnetic field gradient pulses that are applied to the subject to invert or excite magnetic spins, induce magnetic resonance, refocus magnetic resonance, manipulate magnetic resonance, spatially and otherwise encode the magnetic resonance, to saturate spins, and the like. More specifically, gradient pulse amplifiers 20 apply current pulses to a whole body gradient coil assembly 22 to create magnetic field gradients along x-, y-, and z-axes of the examination region 14.

For brain imaging applications, it is preferable to lo choose the y-direction (posterior-to-anterior or anterior-to-posterior direction) to represent the phase encoding direction and the x-direction (left-to-right or right-to-left direction) in light of the ellispoidal shape of the head and the relatively symmetric side-to-side composition of the brain.

An RF transmitter 24, optionally digital, applies RF pulses or pulse packets to a whole-body RF coil 26 to transmit RF pulses into the examination region. A typical RF pulse is composed of a packet of immediately contiguous pulse segments of short duration which taken together with each other and any applied gradients achieve a selected magnetic resonance manipulation.

The RF pulses are used to saturate, excite resonance, invert magnetization, refocus resonance, or manipulate resonance in selected portions of the examination region. For whole-body applications, the resulting resonance signals, generated as a result of a selected manipulation, are also commonly picked up by the whole-body RF coil 26. Alternately, for generating RF pulses in limited regions of the subject, local RF coils are commonly placed contiguous to the selected region. For example, as is known in the art, an insertable head coil 28 is inserted surrounding a selected brain region at the isocenter of the bore. Other surface coils or other such specialized RF coils may also be employed. Preferably, the whole-body RF coil 26 induces resonance and the local RF coil receives magnetic resonance signals emanating from the selected region. In other embodiments, the local RF coil excites and receives the resulting magnetic resonance signals.

Regardless of the RF coil configuration, the resultant RF magnetic resonance signals are picked up by one or another of the RF coils employed and demodulated by a receiver 32. Preferably, a sequence control circuit 40 controls the gradient pulse amplifiers 20 and the RF transmitter 24 to produce an MRI pulse sequence that generates magnetic resonance (MR) signals or echoes received and sampled by the receiver 32.

The MRI pulse sequence is produced by sequence control circuit 40 in accordance with user input 38, which is input to sequence optimization circuitry or processor 44. User input includes, for example, phase and read encoding resolution, rate and time parameters, and so forth. Additional sequence parameters 42 which, for example, are predetermined, dependent on the particular imaging application or experiment, dependent on the particular values of user input 38, and so forth, are also input to sequence optimizer 44.

A processor or circuitry 46 for calculating the amount of dead time 112 and/or 112' (see FIG. 2), if any, based on the initial sequence parameters, is coupled to sequence optimizer 44. The dead time information may then be stored in memory 48. If it is determined that dead time exists in the sequence based on the initial sequence parameters, the user can be informed that scanning efficiency can be increased via user output 66 over line 64. For example, the user can be informed that by increasing the number of phase encoding steps, N/2 ghost removal processor 36 may be turned off or disabled. This user feedback 66 finds additional utility in providing or facilitating operator training in selecting parameters to increase imaging efficiency. It will be recognized, however, that in further embodiments, sequence optimization may be performed automatically under preprogrammed control, for example, in a manner that is transparent to the operator or without otherwise providing user feedback 66.

If, based on the initial scanning parameters, dead time 112 and/or 112' exists and is thus stored in memory 48, the dead time information is sent via line 62 to sequence control 40 for controlling the order of addition of the collected magnetic resonance data into k-space memory 50. Since the final scanning parameters might result in k-space that is not centered around the high contrast (T2 weighted) echoes if the k-space is filled sequentially, it is desirable to include a sorter 34 that controls the order of addition of the data received from receiver 32 into k-space memory 50. Likewise, in the event that dead time exists which is utilized to increase scanning efficiency in accordance with this teaching, ghost removal processor 36 is preferably disabled In preferred embodiments, the MRI scanner runs echo planar imaging (EPI) experiments and data is sampled into a raw data time representation, then into a k-space representation accordingly, in the usual manner. EPI is a rapid MRI technique which is used to produce tomographic images, e.g., at video rates, in perfusion and/or diffusion studies, for functional magnetic resonance imaging (fMRI), etc. Preferably, the technique records an entire image in a single TR period, where TR represents the repeat time for the EPI sequence, or for multi-slice variants, several temporally interleaved slices of a multi-slice set are acquired in a single period. Although the invention is described herein by way of reference to an EPI pulse sequence, it will be recognized that the present invention finds application in other multi-echo imaging techniques, including but not limited to, fast spin echo, GRASE, HASTE, Express, echo volume imaging, multi-shot methods, spin echo EPI, gradient echo EPI, DWI-EPI, PWI-EPI methods, and other similar techniques, when used for collecting late echo data.

Figure 2:
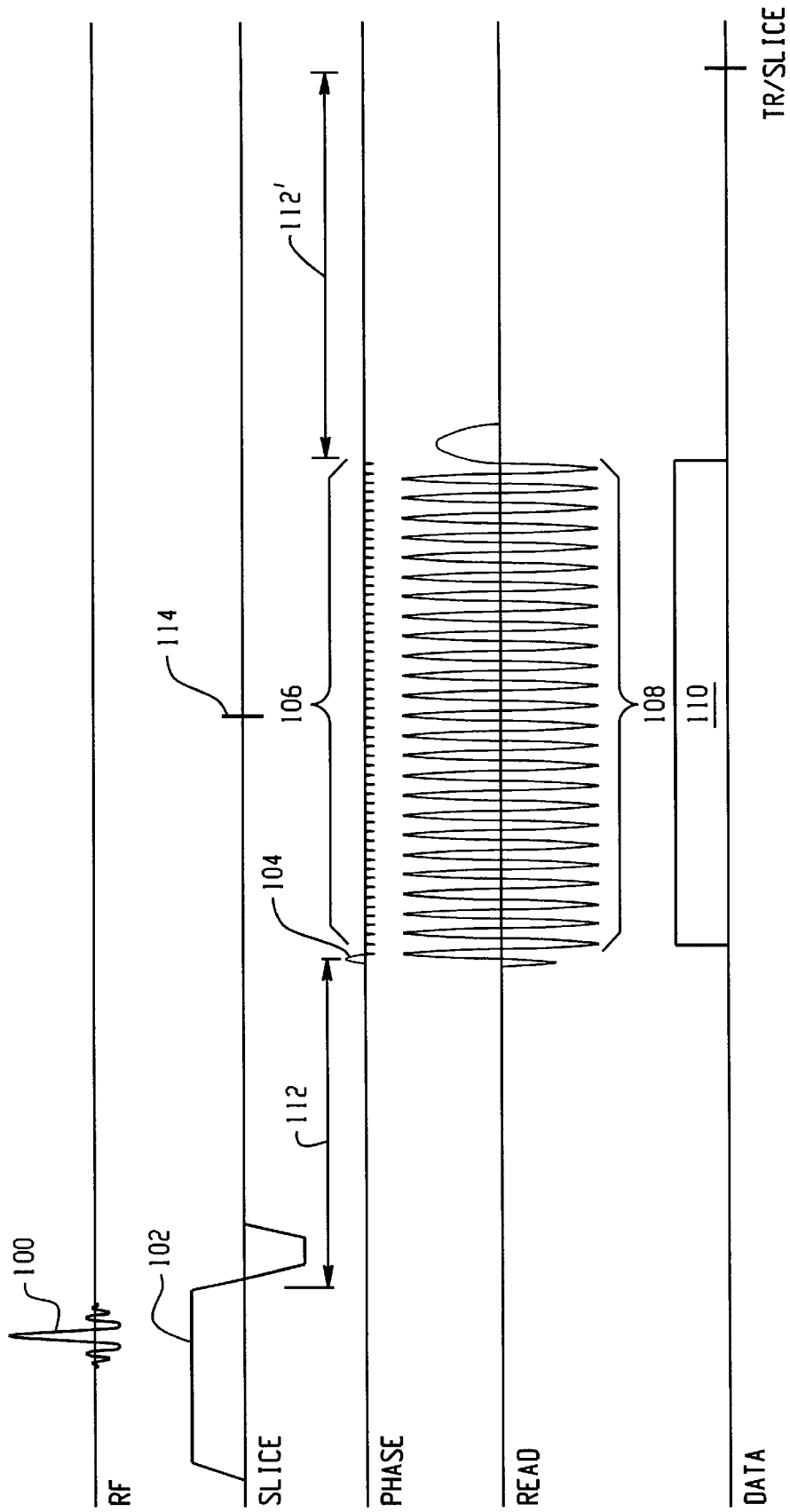
FIG. 2 is a diagrammatic illustration of a typical prior art late echo EPI pulse sequence.
Figure 3:
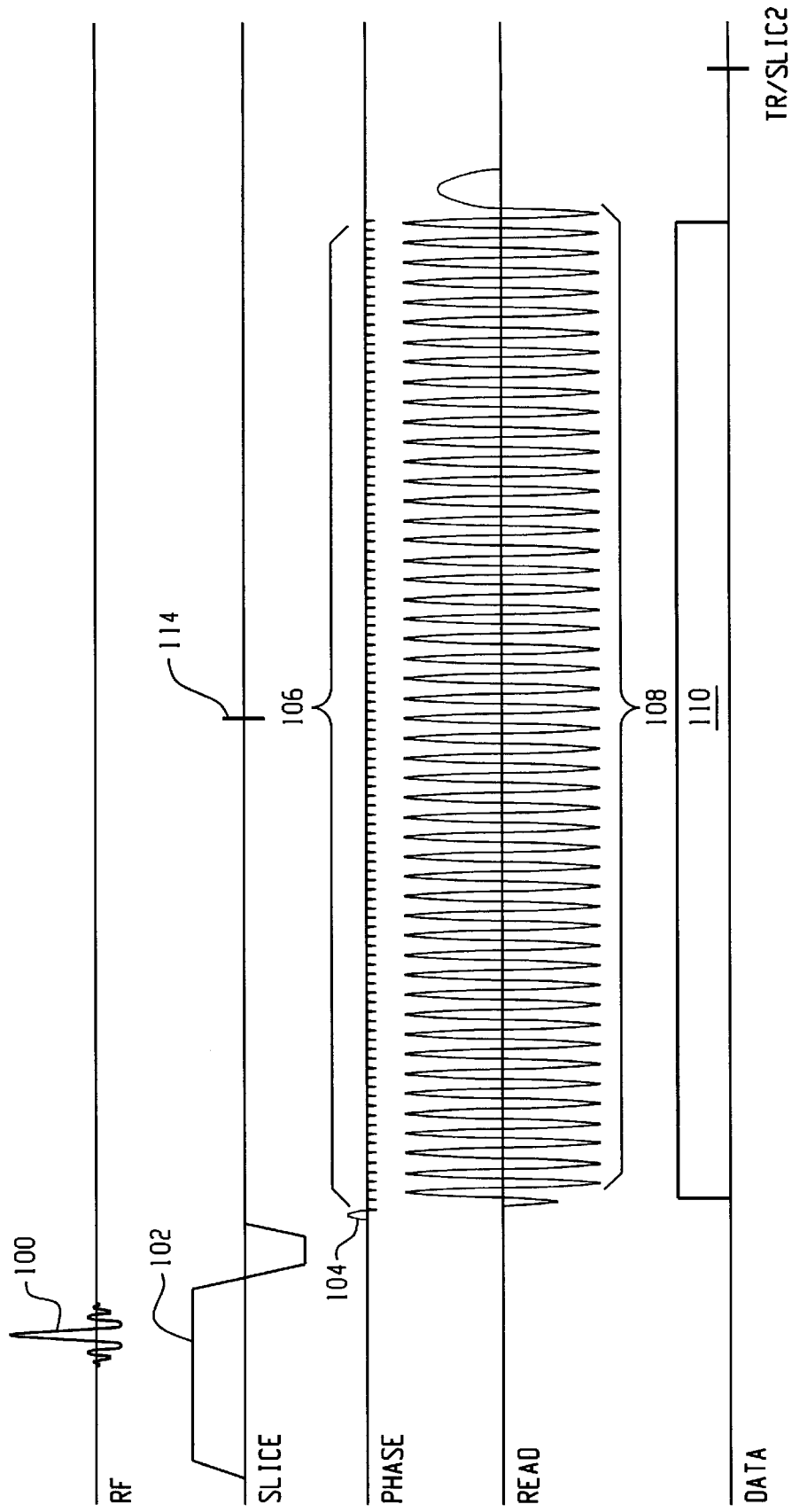
FIG. 3 is a diagrammatic illustration of an EPI pulse sequence produced in accordance with aspects of the present invention.

Referring now to FIGS. 2 and 3, there is shown a timing diagram for a typical prior art EPI sequence (FIG. 2) and the efficient EPI sequence in accordance with this teaching (FIG. 3). The EPI sequence begins with an excitation RF pulse 100 which is applied in conjunction with a slice selection gradient pulse 102 to excite resonance in a selected slice. The RF pulse 100 is applied via the RF coil 26 (FIG. 1) or another specialized RF coil and the slice select gradient pulse 102 is applied via the gradient coil assembly 22 (FIG. 1), preferably, in the z-direction. An initial phase encoding gradient pulse 104 is applied at the onset of the data acquisition period to set the first phase encode step, followed by a series of phase encoding gradient blips 106 to step the phase encoding.

A read gradient 108 is cycled to induce gradient or field echoes and to frequency encode each echo. The phase encoding gradient blips 106 step each echo to another line of k-space. The phase and frequency encoded echoes are sampled in the data acquisition period, represented by data acquisition window 110. In FIG. 2, a delay time 112 occurs after application of the RF excitation pulse 100 and before application of the phase encoding gradient pulses 106 and initial data sampling. Likewise, in FIG. 2, there also appears a delay time or dead time 112' occurring after the close of data acquisition window 110 and before time TR. More specifically, in the illustrated embodiment, phase encode pulse 104 moves the phase encoding to one edge of k-space. Each blip 106 steps the phase encoding one step toward the opposite edge. The delay 112 is selected such that a center echo, which center echo is at the center of k-space and has zero phase encoding occurs at a time 114 after application of the RF excitation pulse 100. The time 114 is selected by the operator to provide an optimum ratio of T1 and T2 weighting for the tissue of interest. For example, for fMRI applications or other applications utilizing late TEs, it may be desirable to order the phase encoding steps such that the more heavily T2-weighted echos fall in the central portion of k-space. Of course, phase encoding gradients can be applied to step through k-space in other patterns.

Figure 4:
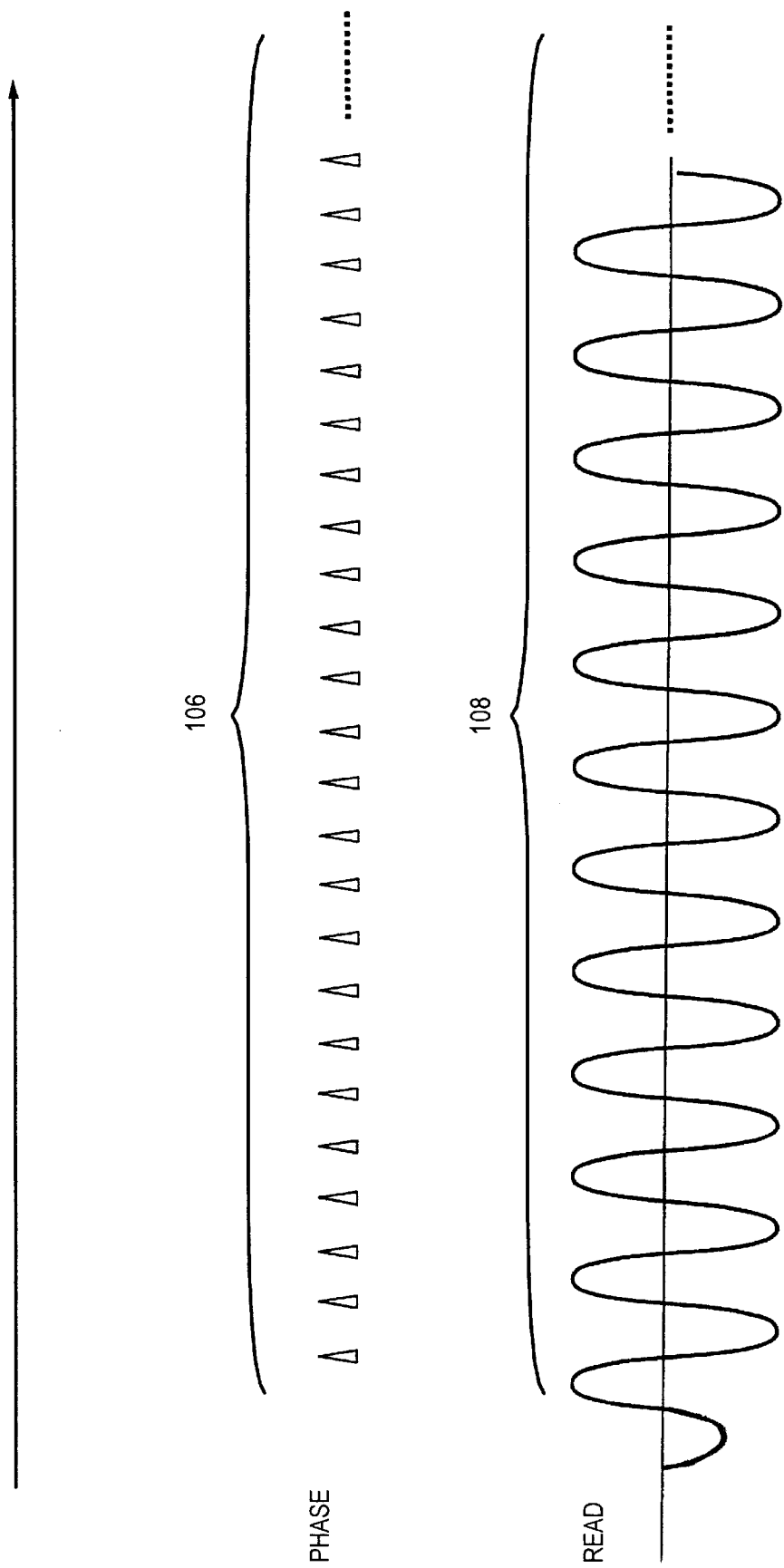
FIG. 4 depicts a magnified portion of the EPI pulse sequence shown in FIG. 3.

With particular reference to FIG. 4, each phase encoding gradient pulse blip 106 is followed by a lobe of the frequency encoding gradient 108. The resonance echo signal is recorded under each lobe to generate a corresponding phase encoded data line. The next phase encoding gradient pulse blip 106 is followed by a reverse polarity lobe of the frequency encoding gradient 108, during which time the next signal with the next phase encoding is recorded. The pattern continues until the sequence is completed with each collected signal corresponding to a horizontal data line in k-space.

As can be seen in FIG. 3, the time period 112 of FIG. 2 is eliminated, with phase and frequency encoding gradients being applied and data acquisition beginning immediately after application of the RF pulse 100 and slice select gradient 102. In additional embodiments (not shown), the time delay 112 is partially eliminated, i.e., wherein data acquisition occurs during a portion of time delay 112 sufficient to achieve some desired or predetermined increase in efficiency, for example, to provide a sufficient degree of phase encoding oversampling to shift N/2 ghosting away from the region of interest.

Preferably, additional phase encoding steps are added during the delay time 112 to generate additional data lines with additional phase encoding. This data can be acquired with no increase in imaging time. However, in certain embodiments of the present invention, additional phase encode steps can be performed after the close of the conventional data acquisition window 110 by extending the echo train length (ETL) into at least a portion of the dead time 112'. Where time TR is an operator specified value and still further phase encoding steps are desired, the TR may be extended to accommodate the additional phase encode steps. The number of additional phase encode steps obtainable in this manner is constrained by the maximum TR which in turn is limited by a selected T2* for the object under examination, although the TR may be effectively constrained to a lesser value given tolerable asymmetry limits for a given application or scanning experiment. Furthermore, since increasing TR increases imaging time, the extent to which TR may be extended will also be determined by the time-criticality of the application. In the preferred embodiments, however, TR is not extended. Also, echo time 114 is preferably preserved at the center of k-space.

In still other embodiments of the present invention, the additional phase encoding steps can be obtained by performing additional phase encoding steps during at least a portion of both the pre-data acquisition dead time window 112 and the post-data acquisition dead time 112'. Where the sequence and hardware constraints permit additional phase encoding steps to be performed in both time periods 112 and 112', k-space is loaded in sequential fashion with the data acquisition at the center of k-space preserved at the TE of interest (maximum contrast) without the need to otherwise modify the sequence to provide any special reordering or sorting of the k-space data. Again, tolerable limits to asymmetry and image throughput requirements will determine the extent to which phase encode steps may be obtained during the delay 112'.

Figure 6A:
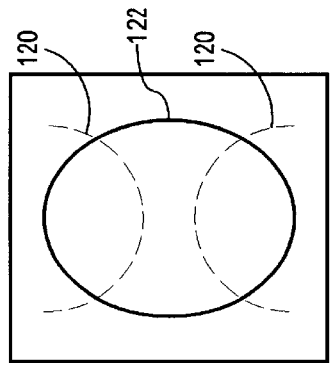
FIGS. 5A and 6A are diagrammatic illustrations showing exemplary trajectories of k-space data as it is collected into a k-space matrix using the prior art EPI sequence of FIG. 2 and the inventive EPI sequence of FIG. 3, respectively.
Figure 5A:
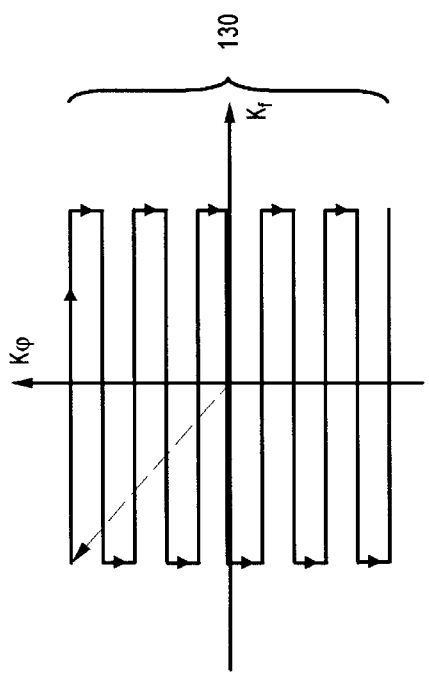

Referring now to FIG. 5A, the phase encode gradient steps the k-space trajectory for the prior art pulse sequence shown in FIG. 2 to the top of k-space. Each blip 106 steps the acquired data one step down. The phase accumulation effect of the series of blips 106 provides a rectilinear k-space trajectory 130 centered about the echo time providing greatest contrast. FIG. 6A illustrates a position of a potential N/2 ghost artifact 120, shown in broken lines relative to an image 122. In particular, FIG. 6A shows the image obtained without the additional phase encoding steps in accordance with this teaching. As can be seen, N/2 ghost 120 undesirably overlaps the true image 122 of the subject.

Figure 5B:
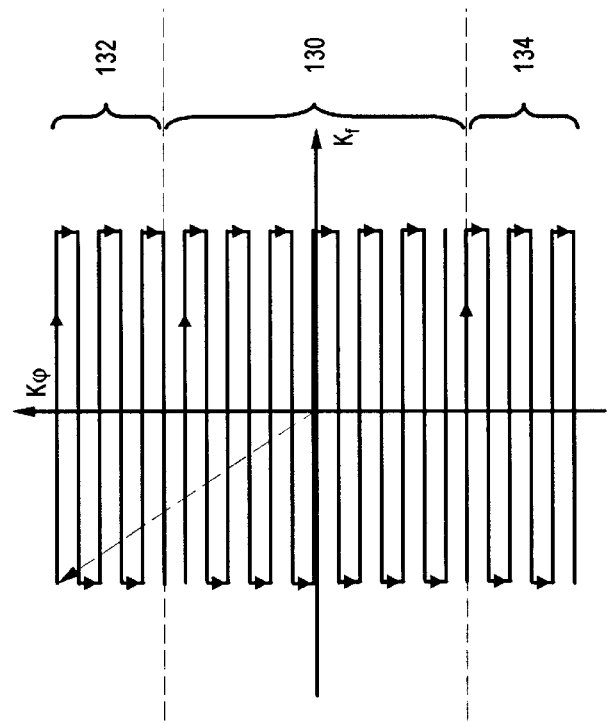

Referring now to FIG. 5B, a phase encode gradient pulse 104 steps the k-space trajectory for the pulse sequence of FIG. 3 above the top of the k-space map 130 of FIG. 5A. Each blip 106 steps the acquired data one step down, until the k-space trajectory extends below the region 130, thus collecting data in regions 132, 130, and 134. The trajectory shown in FIG. 5B is exemplary only and other trajectories that preserve the data lines with the least phase encoding near the selected TE are also contemplated.

Figure 6B:
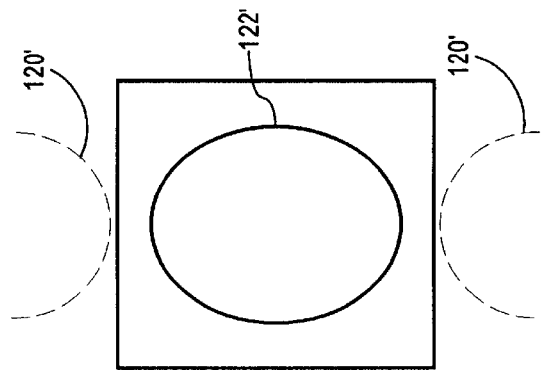
FIGS. 5B and 6B are diagrammatic illustrations of exemplary imaging experiment FOVs showing a primary object image and the relative placement of associated N/2 ghosting using the prior art EPI sequence of FIG. 2 and the inventive EPI sequence of FIG. 3, respectively.

With reference to FIG. 6B, a position of the N/2 ghost artifact 120', shown in broken lines relative to image 122' as additional data lines in regions 132 and 134 (FIG. 5B) are incorporated into the reconstitution, shift away from the region of interest 122'. With sufficient extra data lines, e.g., 100% oversampling, the ghosts can fall completely outside the displayable portion of the reconstructed image.

The time delay 112 is dependent on the gradient hardware, i.e., the peak slew and peak gradient limitations of the particular scanning apparatus (see FIG. 4) as well as the parameters of a given scanning operation, such as operator selected constraints in resolution, contrast, and asymmetry. Thus, the time delay or dead time, if present, will vary in accordance with specified resolution and contrast parameters and tolerable asymmetry in the image for a given scan and for peak slew and peak gradient hardware constraints.

Thus, in certain embodiments, it will be desirable to collect data during the entire time delay in order to achieve maximum efficiency. However, in certain other embodiments, it may be desirable to utilize only a portion of the time delay. For example, for given resolution, contrast and asymmetry parameters, and for given peak slew rate and gradient limitations, 100% oversampling can be achieved using only a portion of the dead time. Likewise, if the dead time is insufficient to provide the degree of oversampling desired, it may be possible to additionally extend data acquisition window 110 temporally to sample later echo data, with T2* and tolerable asymmetry being the limiting factors.

In another embodiment in which the delay time 112 is sufficiently long as to permit 100% oversampling, the size of the k-space steps are cut in half. The phase encode gradients are set such that one of the even and the odd phase encode steps is taken during the delay period and the others are taken in the window surrounding TE.

Referring again to FIG. 1, the raw data collected by the receiver 32 is loaded or sampled into k-space as described above. Preferably, the k-space data is stored in a memory 50 or other similar storage device. As it is being loaded into the k-space memory 50, the data is rebinned or reordered, e.g., by sorter 36, to fit the otherwise smoothly collected raw data into the rectilinear constraints of the k-space matrix or grid.

A reconstruction processor 52, acting on the k-space data from the memory 50, reconstructs an image representation of the subject by applying a two-dimensional (2D) Fourier transform or other appropriate reconstruction algorithm to each slice. The resulting slice image is a matrix or two-dimensional pixel array of complex intensity values, the magnitudes of which represent or visualize a planar slice. The slice images are then stacked in a volume image memory 56 which is accessed by a video processor 58 that prepares and/or formats the reconstructed image for display on a monitor 60 such as a video monitor, active matrix display, CCD display, LCD display, CRT monitor, or other such output device that provides a human-readable depiction or rendering of the resultant image.

Figure 7:
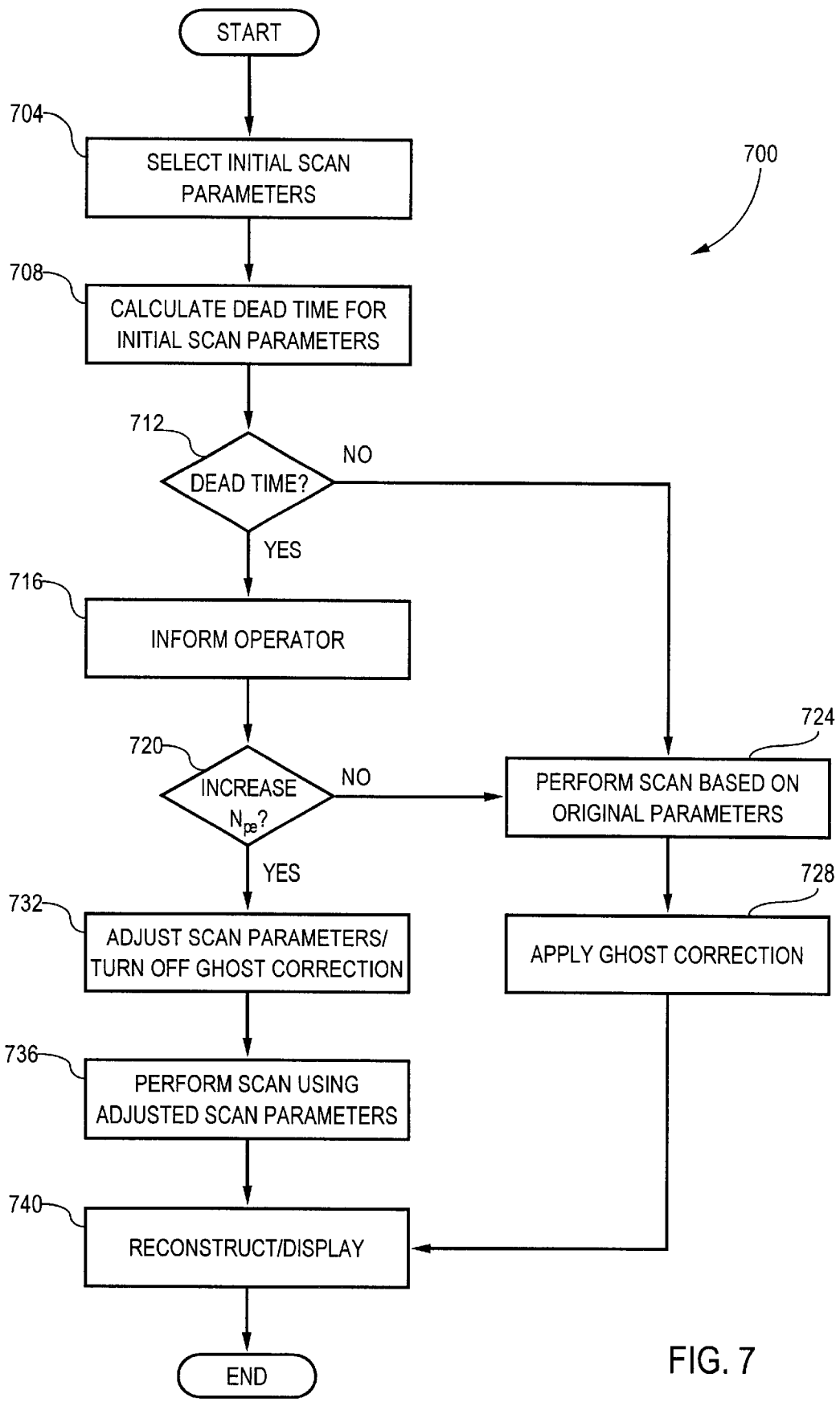
FIGS. 7 and 8 are flow charts outlining exemplary methods according to preferred embodiments of the present invention.

The flowchart of FIG. 7 illustrates a preferred method 700 for improving the efficiency of an EPI or other similar scanning technique. In a step 704, for example, during a "pilot" or "adjustment" procedure, one or more resolution and contrast parameters for a given scanning experiment are specified to provide the desired level of image resolution and contrast. Preferably, a pilot imaging sequence is performed to generate a pilot image which is output to a display. The pilot image aids the operator in sizing the field of view.

The user selectable parameters may include the field of view in the read or frequency encode direction ($FOV_{read}$), field of view in the phase encode direction ($FOV_{pe}$), echo time (TE), repeat time (TR), the number of slices ($N_{slices}$), the number of samplings of each data line ($N_{ro}$), an upper limit for the tolerated asymmetry in the echo scanning parameters selected by the operator, resolution, and contrast parameters. The parameters are selected just prior to the time of scan to match the particular anatomy of the patient or the object to be scanned (e.g., the patient's head or any other body part to be imaged). In certain embodiments, all of the scanning parameters are selected by the user, although it will be recognized that allowable values for such parameters may be constrained and/or determined by both the sequence design and the nature of the gradient hardware parameters and that in some instances, it may be desirable to force certain parameters to a default or prespecified value. In certain embodiments, the parameter values may be input by the user under programmed control, e.g., using a series of questions, interactive prompts, graphical user interface, and so forth.

In a step 708, the sequence parameters defining a prototype MR acquisition sequence are analyzed to determine whether there exists any dead time 112 (see FIG. 2) in the prototype. The analysis is preferably performed by an automated or computer generated optimization procedure. This analysis can be performed by a number of methods, for example, by performing calculations or using look-up tables that take into account the selected parameters as well as hardware characteristics (max slew, max peak gradient, SAR, etc.). In a step 712, if there is no dead time in which phase encoding resolution may be increased, the method proceeds to a step 724 and the scan is performed using the original scan sequence.

If there is dead time associated with the originally selected scan sequence, a message or other feedback, e.g., visual feedback, is generated to inform the operator in a step 716 that the selected parameters will result in inefficient use of the sequence. The user may then be informed that (1) resolution can be increased, (2) interecho spacing can be decreased, or that both an increase in resolution and a decrease in interecho spacing is possible.

Preferably, the user is informed that the dead time exists and that additional phase encoding steps can be performed and the user is given the option of increasing the number of phase encoding steps ($N_{pe}$). The operator is preferably informed of the level of possible increased $N_{pe}$ that may be selected. The operator is preferably also informed of the percentage or degree of anti-aliasing protection available. The operator then chooses whether to improve phase encoding resolution. For example, if sufficient $N_{pe}$ steps for oversampling for extending the $FOV_{pe}$ are available, the need for ghost-removal algorithms would be minimized or obviated. Reducing or eliminating the processing overhead associated with such ghost-correction routines is particularly useful in real-time or time-critical applications, such as fMRI. In preferred embodiments, the operator may be provided with a recommendation (for example, based on the degree of oversampling obtainable) as whether to increase phase encode resolution, whether to turn off post-processing ghost corrections, and so forth. In alternative embodiments, increasing phase encoding resolution and/or disabling ghost removal post processing can be preformed automatically under preprogrammed control, e.g., when a predetermined or threshold degree of oversampling can be achieved.

If the operator specifies an increase in the $N_{pe}$ in a step 720, the scanning parameters are adjusted in a step 732, i.e., increasing phase-encoding resolution, and ghost correction post-processing is optionally turned off. The scan is performed in a step 736 using the refined prototype acquisition sequence based on the adjusted parameters and the image is reconstructed and displayed in a step 740. If the operator specifies not to increase the $N_{pe}$, the process proceeds to the step 724 and the scan is performed using the original prototype acquisition sequence. After the step 724, a ghost-correction routine is optionally applied in a step 728 and the image is reconstructed and displayed in the step 740. In addition to, or as an alternative to, displaying the image in the step 740, image data is stored in memory for archival and/or for display at a later time.

Figure 8:
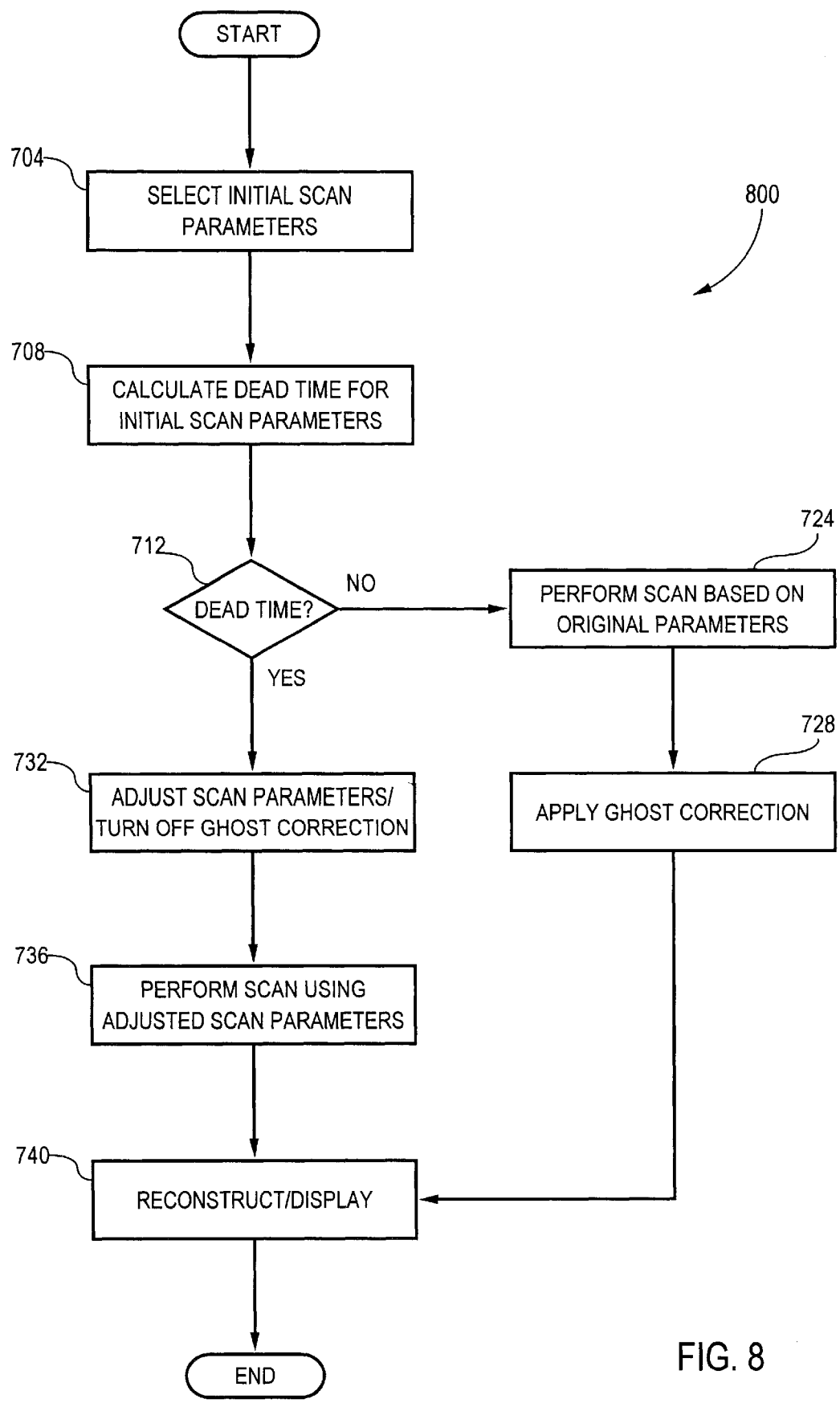

FIG. 8 illustrates an alternative method 800 in accordance with the present invention that is similar to the method 700 (FIG. 7), but which varies from method of FIG. 7 in that the steps 716 and 720 are omitted. Thus, in the process 800, if it is determined that dead time 112 exists in the prototype acquisition sequence defined by the original parameters, the scanning parameters are automatically adjusted to increase the $N_{pe}$. Post-processing ghost correction is optionally automatically turned off when the degree of oversampling obtainable during the dead time 112 is above a predetermined threshold.

The description above should not be construed as limiting the scope of the invention, but as merely providing illustrations to some of the presently preferred embodiments of this invention. In light of the above description and examples, various other modifications and variations will now become apparent to those skilled in the art without departing from the spirit and scope of the present invention as defined by the appended claims. Accordingly, the scope of the invention should be determined solely by the appended claims and their legal equivalents.

Having thus described the preferred embodiments, the invention is now claimed to be:

1. A method of magnetic resonance imaging, said magnetic resonance imaging being of a type employing a scanning sequence comprising an RF excitation pulse, a plurality of phase encoding gradient pulses, and a cyclically switched frequency encoding gradient to produce an echo train emphasizing late echoes, the scanning sequence having a prespecified length of time, said method comprising the steps of:

(a) supporting a subject in an examination region of an MRI scanning apparatus, the MRI scanning apparatus being of a type having user selectable sequence, resolution, and contrast parameters;

(b) inputting the user selectable sequence, resolution, and contrast parameters to define a prototype MR acquisition sequence, the prototype MR acquisition sequence defining a pattern of application of the RF excitation pulse, the plurality of phase encoding gradient pulses, and the cyclically switched frequency encoding gradient, and a first data acquisition period for acquiring k-space data, the first data acquisition period temporally coextensive with the application of the plurality of phase encoding gradient pulses and the cyclically switched frequency encoding gradient;

(c) analyzing the prototype MR acquisition sequence to determine whether at least one of (1) a first dead time period occurs between application of the RF excitation pulse and the data acquisition period, and (2) a second dead time period occurs after the data acquisition period and before the end of the sequence;

(d) in response to determining an existence of at least one of the first and second dead time periods: (1) defining a refined prototype acquisition sequence and a second data acquisition period in which k-space data is collected during at least a portion of at least one of the first dead time period and the second dead time period; and (2) applying the second sequence to induce a detectable magnetic resonance signal from a selected region of the subject;

(e) receiving and demodulating said detectable magnetic resonance signal to generate k-space data; and (f) processing the k-space data to generate an image representation.

2. The method according to claim 1, wherein the refined prototype acquisition sequence includes more phase encoding steps than the prototype MR acquisition sequence.

3. The method according to claim 1, wherein the refined prototype acquisition sequence provides greater resolution in the phase encoding direction than the prototype MR acquisition sequence.

4. The method according to claim 1, wherein a ratio of a number of phase encoding steps in the refined prototype acquisition sequence to a number of read encoding steps in the refined prototype acquisition sequence is proportional to dimensions of an imaged field of view of the subject.

5. The method according to claim 1, wherein the refined prototype acquisition sequence provides less visibility of N/2 ghost artifacts than the prototype MR acquisition sequence.

6. The method according to claim 1, wherein the user selectable parameters include at least one of: time to echo, time to repeat, number of slices, field of view, number of slices, and tolerable asymmetry.

7. The method according to claim 1, further including:
performing a pilot imaging procedure to generate a pilot image; and
outputting the pilot image.

8. The method according to claim 1, wherein the second pulse sequence is an echo planar imaging sequence.

9. A method of determining a magnetic resonance imaging sequence, said magnetic resonance imaging sequence being of a type employing an RF excitation pulse in conjunction with a plurality of phase encoding gradient pulses and a cyclically switched frequency encoding gradient to produce an echo train, said magnetic resonance imaging sequence being further of a type utilizing late echos of said echo train, said method comprising:

(a) inputting the user selectable sequence, resolution, and contrast parameters to define a prototype MR acquisition sequence defining a pattern of application of the RF excitation pulse, the plurality of phase encoding gradient pulses, and the cyclically switched frequency encoding gradient, and a first data acquisition period for acquiring k-space data, the first data acquisition period temporally coextensive with the application of the plurality of phase encoding gradient pulses and the cyclically switched frequency encoding gradient;

(b) analyzing the prototype MR acquisition sequence to determine whether there exists a dead time period between application of the RF excitation pulse and the data acquisition period; and (c) if there exists a dead time period between application of the RF excitation pulse and the data acquisition period, defining a refined prototype acquisition sequence and a second data acquisition period wherein k-space data is collected during at least a portion of the dead time period.

10. The method of claim 9, further comprising:
if there exists a dead time period between application of the RF excitation pulse and the data acquisition period, reporting to an operator an indication of inefficient use of the sequence.

11. The method of claim 10, further comprising:
if there exists a dead time period between application of the RF excitation pulse and the data acquisition period, reporting to the user that resolution can be increased.

12. A magnetic resonance imaging apparatus comprising:

(a) magnets for creating a temporally constant magnetic field through an examination region;

(b) at least one radio frequency coil assembly disposed adjacent the examination region for transmitting radio frequency signals into the examination region and for receiving magnetic resonance signals emanating from the examination region;

(c) a transmitter connected with the at least one radio frequency coil assembly for supplying radio frequency pulses thereto;

(d) a plurality of gradient coils disposed adjacent the examination region for creating magnetic field gradients across the examination region;

(e) gradient pulse amplifiers connected with the gradient coils for applying current pulses to the gradient coils for selectively creating magnetic field gradients across the examination region;

(f) an imaging sequence control connected with the transmitter and the gradient amplifiers, the imaging sequence control comprising: (i) control logic receiving user selectable sequence, resolution, and contrast parameters to define a prototype MR acquisition sequence and a first data acquisition period for acquiring k-space data, the prototype MR acquisition sequence defining a pattern of application of an RF excitation pulse and a plurality of phase encoding gradient pulses cyclically switched frequency encoding gradient, the first data acquisition period being temporally coextensive with the application of the plurality of phase encoding gradient pulses and the frequency encoding gradient; (ii) control logic analyzing the prototype MR acquisition sequence and measuring a dead time period between application of the RF excitation pulse and the data acquisition period; and (iii) control logic defining a refined prototype acquisition sequence and a second data acquisition period in which k-space data is collected during at least a portion of the dead time period;

(g) a receiver that receives and demodulates the magnetic resonance signal to obtain phase encoded data lines; and (h) an image reconstruction processor for reconstructing the data lines into an electronic image representation.

\* \* \* \* \*